(12) United States Patent
Helbling et al.

(10) Patent No.: US 8,823,706 B2
(45) Date of Patent: Sep. 2, 2014

(54) METHOD, PROGRAM AND PRODUCT EDITION SYSTEM FOR VISUALIZING OBJECTS DISPLAYED ON A COMPUTER SCREEN

(75) Inventors: Marc Helbling, Paris (FR); Eric Grange, Argenteuil (FR)

(73) Assignee: Dassault Systemes, Velizy Villacoublay (FR)

( * ) Notice: Subject to any disclaimer, the term of this patent is extended or adjusted under 35 U.S.C. 154(b) by 837 days.

(21) Appl. No.: 12/758,729

(22) Filed: Apr. 12, 2010

(65) Prior Publication Data

US 2010/0262930 A1    Oct. 14, 2010

(30) Foreign Application Priority Data

Apr. 14, 2009 (EP) .................................. 09290275

(51) Int. Cl.
| | | |
|---|---|---|
| *G06F 17/00* | (2006.01) | |
| *G06T 1/00* | (2006.01) | |
| *G06T 15/00* | (2011.01) | |
| *G06T 17/00* | (2006.01) | |
| *G06T 15/50* | (2011.01) | |
| *G06T 15/60* | (2006.01) | |
| *G06T 19/20* | (2011.01) | |
| *G06F 17/50* | (2006.01) | |

(52) U.S. Cl.
CPC ................ *G06F 17/50* (2013.01); *G06T 19/20* (2013.01); *G06T 15/50* (2013.01)
USPC ............ 345/426; 345/418; 345/419; 345/420

(58) Field of Classification Search
USPC .......................................... 345/418–420, 426
See application file for complete search history.

(56) References Cited

U.S. PATENT DOCUMENTS

| | | |
|---|---|---|
| 2003/0189586 A1 | 10/2003 | Vronay et al. |
| 2006/0164414 A1* | 7/2006 | Farinelli ........................ 345/422 |
| 2008/0231631 A1 | 9/2008 | Matsumura et al. |

FOREIGN PATENT DOCUMENTS

| | | |
|---|---|---|
| EP | 1 530 119 A2 | 5/2005 |
| JP | 05-324798 | 12/1993 |

(Continued)

OTHER PUBLICATIONS

Dietrich, Al, et al., "VRML Scene Graphics on an Interactive Ray Tracing Engine" IEEE Proceedings, Virtual Reality, pp. 109-116 and 282.*

(Continued)

*Primary Examiner* — Ke Xiao
*Assistant Examiner* — Robert Craddock
(74) *Attorney, Agent, or Firm* — Hamilton, Brook, Smith & Reynolds, P.C.

(57) ABSTRACT

This invention is directed to a method, a program and a production edition system of visualization of objects in a scene. The method according to the invention aims at indicating a distance between objects by modifying a property (like a rendering property) of a target object according to a distance to an active object. Typically, a light source is simulated and attached at the active object and the scene is accordingly modified dynamically. Such a method bypasses the basic materialization of the distance between objects. Hence, no display of extrinsic elements is mandatory and possible interferences are prevented. In addition, the method allows, by definition, a progressive modification of e.g. a rendering of the target object. Thus, modifications in the scene are better understood by the user and ergonomics are improved.

24 Claims, 5 Drawing Sheets

(56) References Cited

FOREIGN PATENT DOCUMENTS

| JP | 11-175746 | 7/1999 |
|----|-----------|--------|
| JP | 2001-307134 | 2/2001 |
| JP | 2002-373348 | 12/2002 |
| JP | 2005-141102 | 2/2005 |
| JP | 2008-165784 | 7/2008 |
| JP | 2008-234473 | 10/2008 |

OTHER PUBLICATIONS

Sohrt, W., et at., "Interaction with Constraints in 3D Modeling", Department of Computer Science, University of Utah, Proceedings, Symposium on Solid Modeling Foundations and CAD/CAM Applications, pp. 387-396, Jun. 5, 1991.
Angelidis, A., et al., "Modeling by Deformation Using Swept User-Defined Tools", retrieved from internet, www.cs.otago.ac.nz/postgrads/al exis/research/OUCS-2003-03; 7 pages, retrieved from internet Mar. 28, 2008.
Dietrich, Al, et al., "VRML Scene Graphs on an Interactive Ray Tracing Engine" IEEE Proceedings, Virtual Reality, pp. 109-282; Mar. 27, 2008.
Lietsch, S., et al, "Light Simulation in a Distributed Driving Simulator", 4291:343-352; Jan. 1, 2006.
Ward, G.J., "The Radiance Lighting Simulation and Rendering System," Computer Graphics Proceedings, pp. 459-472, Jan. 1, 2001.
Wagner, M., et al., "Shared Reality Meeting—A Collaborative Augmented Reality Environment", The First IEEE International Workshop, 2 pages, Sep. 29, 2002.
European Search Report of Application No. EP 09 29 0275 dated Dec. 22, 2009.
Yano, Nahoko, et al., *Construction of a Database Design Toolkit for the Virtual World Database System*, Report of Study of Information Processing Society of Japan, vol. 2003, No. 71, pp. 399-405, Information Processing Society of Japan, Japan, Jul. 17, 2003.

\* cited by examiner

METHOD, PROGRAM AND PRODUCT EDITION SYSTEM FOR VISUALIZING OBJECTS DISPLAYED ON A COMPUTER SCREEN

RELATED APPLICATION

This application claims priority under 35 U.S.C. §119 or 365 to European Application No. 09290275.8, filed Apr. 14, 2009.

The entire teachings of the above application are incorporated herein by reference.

FIELD OF THE INVENTION

The invention relates to the field of computer-implemented programs and systems, and more specifically to product edition systems, which provide a graphical user interface (GUI) for displaying objects on a computer screen.

BACKGROUND OF THE INVENTION

Product edition systems are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of products and programs are offered on the market for the design of objects (or parts) or assemblies of objects, forming a product, such as the one provided by Dassault Systèmes under the trademark CATIA. These CAD systems allow a user (e.g. a designer) to construct and manipulate complex three dimensional (3D) models of objects or assemblies of objects. CAD systems thus provide a representation of modeled objects using edges or lines, in certain cases with faces.

Lines or edges may be represented in various manners, e.g. non-uniform rational Bsplines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

In computer-aided techniques, the graphical user interface (GUI) plays an important role as regards the efficiency of the technique. In particular, the GUI provides user/computer interactions.

From a CAD systems standpoint, an object is basically a file which comprises at least a name. These files can be stored on databases. Databases are structured to facilitate storage, retrieval, modification, and deletion of data in conjunction with various data-processing operations. Databases generally consist of a file or set of files that can be broken down into records, each of which consists of one or more fields. Fields are the basic units of data storage. Users retrieve database information primarily through queries. Using keywords and sorting commands, users can rapidly search, rearrange, group, and select the field in many records to retrieve or create reports on particular aggregates of data according to the rules of the database management system being used.

CAD systems include graphic tools for representing the modeled objects to the users. The modeled objects are represented in a scene wherein the spatial relationships between objects are defined. The scene is composed of at least two objects. These graphic tools are dedicated to the creation, the display, the modification of complex objects. In particular, the modification of a property of an object, or the part of an object, can be made via the modification of one or more parameter that determines the property of the object. The property of an object is a set of attributes of the object, that is, a set of qualities or features representative of the object. The modification of one or more parameter may result from the action of a graphic tool on the object. In such a case, modifying the properties of an object is a permanent modification as the modification is saved. For instance, the user may use a milling tool so as to round off the rough edges of a cubic object. The milling tool acts on one or more parameter of the cubic object and modifies geometrical properties of the objects, e.g. the milling tool mills an edge of the cubic object. A modification performed by the milling tool on one or more parameter of the cubic object is thus a permanent modification.

However, the user may wish an easy and progressive modification of one or more property of the object, but also a dynamic modification of said property. For instance, the user may wish a progressive action of the milling tool on the geometrical properties of the cubic object according to the distance between the milling tool and the cubic object.

Thus, one important problem in the field of visualizing objects displayed on a computer screen is that a user may wish to move or modify a property of a given object displayed in the scene according to the distance between this object and another object, i.e. an active object (for instance a tool) acting on a target object (the given object).

The problem of the evaluation of a distance between an object and another object has been discussed in the literature. Several solutions permit to measure the distance between two objects which are displayed in a scene.

For making it possible to the designer to measure a distance between two objects displayed in a scene, most of softwares discussed in the literature provide means for identifying the objects. Indeed, measuring a distance is only possible if at least two objects are identified. In general, softwares use a dedicated mode referred to as "selection mode" which enables to select an object or a part of an object that is the closest in the direction normal of the screen.

Classically the selected object is highlighted so as to visually indicate to the designer what object is selected. However, such a solution does not answer efficiently to the above problem for various reasons. For instance the selection is based on mouse cursor which is not a 3D object in the scene; consequently, it only moves in a 2D plane of the screen. Thus, selection is restricted to the first object in the normal direction of the plane. In addition, one may note that in such a selection process, object attributes are not modified and an overlay is added on the selected object to make the selection visible.

Once an object or a part of an object has been selected by the designer via the "selection mode", the distance between two objects may be measured.

A first known solution for measuring a distance between two objects is stereovision, which reproduces a 3D natural vision. That solution consists in computing two images with a small shift of the point of view and then superposing the two images. To be usable, the designer needs to wear special glasses. In short: this method needs twice more computations (two images per frame instead of a single one are required). It further requires specific device. Finally, it can and does not provide accurate information since it primarily focuses on mimicking human vision.

A second solution relies on projection walls. Projection walls are planes that are axis aligned and delimit the scene. They are used to display the 2D projection of objects. This technique resolves the problem of selecting objects mentioned above. However, even if the display is fully integrated into the scene, it adds a lot of visual complexity. Moreover taking each projection separately is not sufficient for having precise information on distances.

A third solution relies on displaying a panel where distance between two selected objects is "physically" materialized on the screen. Here, various selection schemes of objects are available, including selection through a list of the set of the objects or selection of objects directly in the scene with a dedicated mean (for instance a mouse pointer). Despite that such a solution provides a precise result, it presents a couple of major drawbacks. For instance, the selection of the objects might be cumbersome in a massive scene which comprises multiples objects or part of objects. Another drawback is that the information is not integrated in the scene since panels showing the distance between objects are displayed on the screen and may take a lot of visual place, the objects in the scene being partially or entirely hidden by the panels.

Figure 2:
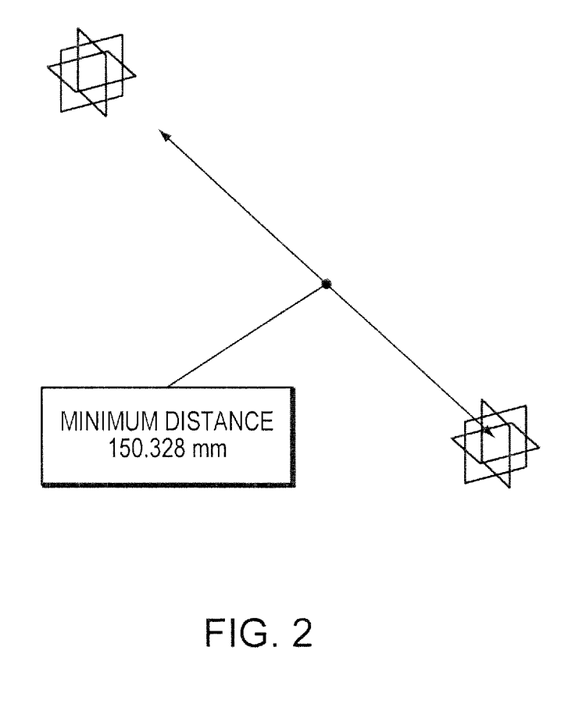
FIG. 2 depicts a solution of the prior art.

Another solution has been developed so as to alleviate the drawback evocated previously. In order to avoid the display of a panel in the scene, the solution consists in displaying the result of the measure directly in the scene. To achieve that goal a line between the objects of interest is plotted, and once the line has been plotted, a numerical value is displayed on the line and show the result of the measure. However, such a solution has several drawbacks. This is depicted in FIG. 2, illustrating the known solution. As shown in the figure, two objects, a cube and a sphere, are part of the scene displayed in the graphical user interface. In order to measure the distance between the sphere and the cube, an arrow is plotted. The arrow links the two objects, and more precisely, the arrow connects two points that respectively belong to one of the two objects displayed, i.e. the centre of the sphere and a point of the face of the cube in front of the sphere. Once the arrow is plotted, the corresponding distance is displayed on a dedicated banner.

Consequently, the measure of a distance depends on the points selected that determine the arrow. Creating the arrow can be difficult notably as the user has to position the points in a 3D scene. For instance, as shown in FIG. 2, the user can easily select the center of the sphere, thanks to a graphical indication. On the contrary, if the user wants to measure the distance between the cube and a closest point of the sphere facing the cube, selection of such a point is not intuitive.

Moreover, if the scene comprises a plurality of objects and if the user wants to measure several distances between objects of the scene, a respective number of arrows has to be determined and plotted. This may lead to arrows crossing each other and jeopardize the interpretation of the relevant data.

Thus, current product edition systems do not provide the possibility for modifying a property of an object displayed in a scene according to the distance between this object and another object.

Therefore, according to the limitations of the existing solutions shortly discussed above, there is a need for an improved method for visualizing objects displayed in a scene on a computer screen and for modifying a property of a scene according to a distance between objects displayed in the scene.

SUMMARY OF THE INVENTION

The invention therefore provides computer-implemented method of visualization of objects displayed on a computer screen, the objects being displayed in a scene, within a graphical user interface of a product edition system, the method comprising the steps of:
  identifying a first object and a second object amongst at least two objects displayed in the scene, the first object being identified as an active object;
  modifying a property of the second object according to a distance between the first object and the second object;
  modifying the scene according to the modified property of the second object.

The method may comprise one or more of the following features:
  the steps of modifying the property of the second object and modifying the scene are carried out concomitantly with a user actuating the first object in the scene;
  the step of identifying objects, the first object is a tool acting on the second object, upon user actuation of the first object:
  the method further comprises, at the step of modifying a property, the property modified is a rendering property of said second object in the scene, and the step of modifying the scene comprises modifying the rendering of said second object in the scene according to the modified property;
  the method further comprises, at the steps of modifying the property of the second object and modifying the scene, simulating effects of a light source attached at the first object, whereby said property is modified according to the light source simulated;
  the step of simulating, effects of the light source are simulated according to a location of the first object, the simulation ignoring a configuration and/or geometry of the first object;
  the step of modifying the scene further comprises rendering the first object independently of the light source being simulated;
  the step of modifying the property and/or modifying the scene further comprises executing a shader program for rendering the second object, the first object being rendered independently of said shader;
  the step of modifying the property comprises modifying a specular reflectivity of a surface of the second object;
  the step of modifying the property comprises modifying a surface normal of a surface of the second object;
  the step of modifying the property further comprises modifying the property of the second object according to a direction defined by the first object and the second object;
  the product edition system comprises a database, the database comprising specifications of said objects, the specifications allowing to generate a geometry and a representation of said objects, the method further comprising a step of storing the modified property on said database;
  the product edition system comprises a database, the database comprising specifications of said objects, the specifications allowing to generate a geometry and a representation of said objects, further comprising a step of storing the modified property on a memory, without storing the modified property on said database;

the scene is a three-dimensional object scene;
the step of identifying comprises the first object is identified as an active object by default or upon user-selection;
the step of modifying the property comprises modifying one or more property amongst the following properties: a rendering property, a geometrical property; and a physical property.

The invention additionally provides a computer-implemented method of visualization of objects displayed on a computer screen, the objects being displayed in a scene, within a graphical user interface of a product edition system, comprising the steps of:
identifying a first object and a second object amongst at least two objects displayed in the scene, the first object being identified as an active object;
modifying a property of the second object according to a distance between the first object and the second object, the property modified is a temporary modification of rendering property of said second object in the scene;
modifying the scene according to the temporarily modified property of the second object;
and wherein the first object is a tool acting on the second object upon user actuation of the first object, the tool performing permanent modifications of the properties of the second object.

The invention further concerns a computer program stored on a computer readable medium, for displaying objects in a Graphical User Interface of a product edition system, comprising code means for causing a computer onto which said computer program is loaded to take all the steps of the method.

The invention still concerns a product edition system, comprising program code means to carry out all the steps of the method.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

A system embodying the invention will now be described, by way of nonlimiting example, and in reference to the accompanying drawings, where.

DETAILED DESCRIPTION OF THE INVENTION

A description of example embodiments of the invention follows.

The teachings of all patents, published applications and references cited herein are incorporated by reference in their entirety.

The invention is directed to a method of visualization of objects in a scene. The method according to the invention aims at indicating a distance between objects by modifying a property (like a rendering property) of a target object according to a distance to an active object.

Typically, a light source is simulated and attached at the active object and the scene is accordingly modified dynamically; such a modification is called "temporary modification" or "rendering modification" as the modification of the object property is not saved. Such a method bypasses the basic materialization of the distance between objects. Hence, no display of extrinsic elements is mandatory and possible interferences are prevented. Further, there is no need to compute extrinsic elements in the scene. As a result, computational resources are preserved and may be, for instance, allocated to other functions of the system. The overall performances of the system are thus improved. Importantly, the user identifies only one object in the scene, i.e. the active object. As a result, the step of identifying is less time consuming and the user can focus on other tasks. In addition, such a method allows, by definition, a progressive modification of e.g. a rendering of the target object. Thus, modifications in the scene are better understood by the user, who is given a better control on the target.

The property of an object is a set of attributes of the object, that is, a set of qualities or features representative of the object. In the field of CAD, the property of an object refers to, but is not limited to, rendering property, geometrical property, and physical property.

Figure 1:
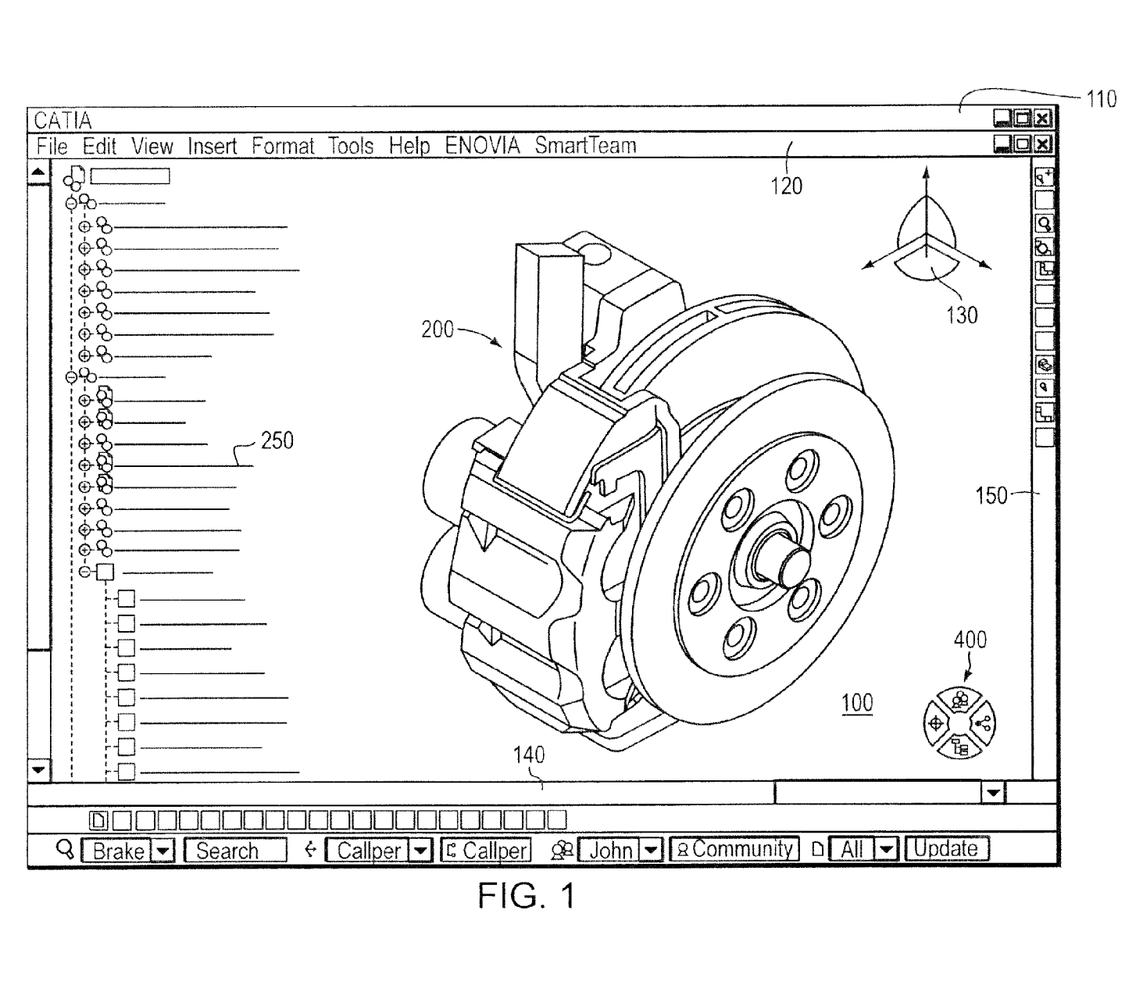
FIG. 1 is an example of a CAD-like graphical user interface (GUI)

In reference to FIG. 1, the exemplified graphical user interface (or GUI) 100 may be a typical CAD-like interface, having standard menu bars 110, 120, as well as bottom and side toolbars 140, 150. Such menu and toolbars contain a set of user-selectable icons, each icon being associated with one or more operations or functions, as known in the art.

Some of these icons are associated with software tools, adapted for editing and/or working on a modeled product 200 or parts of product 200 such as that displayed in the GUI 100. In the following description, "product", "part", "assembly" and the like may be referred to as "part" for the sake of simplicity. Note that the concept of "part" can in fact be generalized to that of "object", wherein an object can be only a "physical" part of the designed product or, more generally, any software tool participating in the design process (but not necessarily "in" the final product).

The software tools may be grouped into workbenches. Each workbench comprises a subset of software tools. In particular, one of the workbenches is an edition workbench, suitable for editing geometrical features of the modeled product 200. In operation, a user (e.g. a designer) may for example pre-select a part of the object 200 and then initiate an operation (e.g. change the dimension, color, etc.) or edit geometrical constraints by selecting an appropriate icon. For example, typical CAD operations are the modeling of the punching or the folding of a 3D modeled object displayed on the screen. Such operations may greatly benefit from the method according to the present invention.

The GUI may for example display data 250 related to the displayed product 200. In the example of FIG. 1, the data 250, displayed as a "feature tree", and their 3D representation 200 pertain to a brake assembly including brake caliper and disc. The GUI may further show various types of graphic tool 130, 400, for example for facilitating 3D orientation of the object, for triggering a simulation of an operation of an edited product or render various attributes of the displayed product 200.

Figure 3:
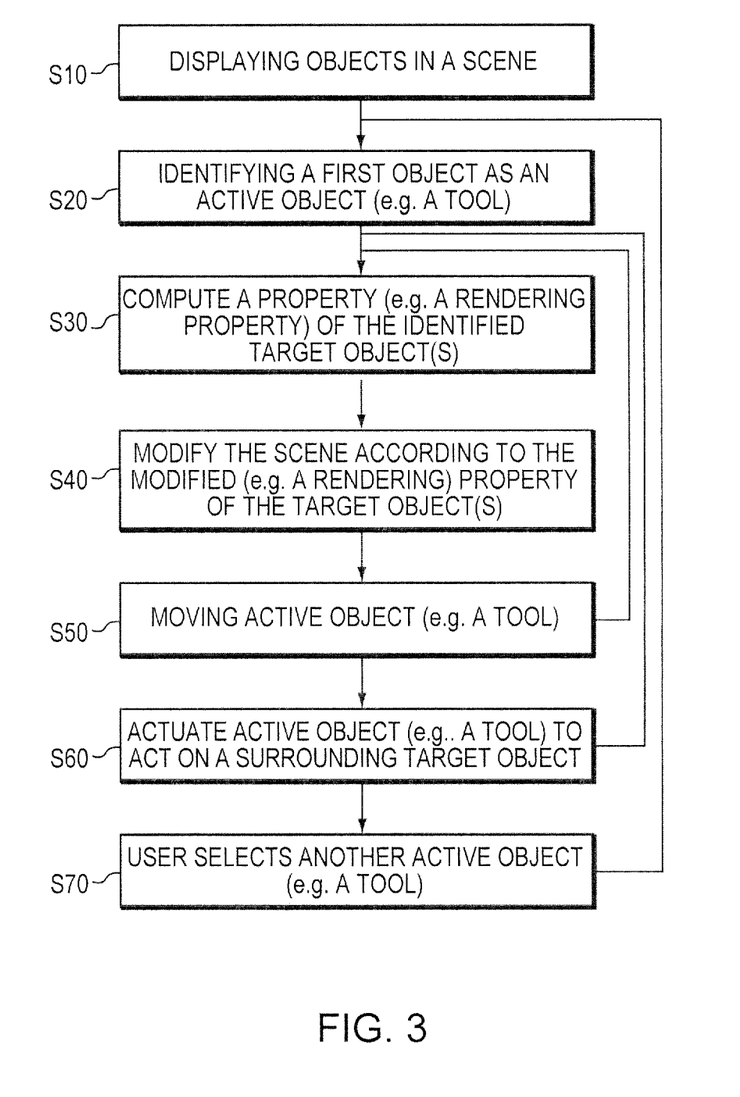
FIG. 3 is a flowchart of a process for carrying out the invention.

FIG. 3 shows a flowchart reflecting a detailed embodiment of the present invention. In reference to this figure, the method aims at providing for visualization of objects displayed in a scene of a computer screen. In particular, the method according to the invention aims at evaluating a distance between objects by modifying a property (e.g. like a rendering property) of a second object according to (i.e., as a function of) a distance to a first object.

A distance is a description of how far apart objects are, that is, the distance is the degree of separation between two objects. The distance may refer to a physical length, a period of time, or an estimation based on other criteria.

Typically, objects are displayed in a scene (step S10), within a GUI as described in reference to FIG. 1. The scene is a space in which spatial relationships between objects are described. The scene is comprised of at least two objects, and the objects may be modeled objects or three-dimensional (3D) modeled objects. Thus, if the scene is comprised of 3D modeled object, the scene is a 3D space.

A three-dimensional (3D) modeled object is a description of an object in a three dimensional (3D) space. A 3D space is a geometric model of a physical universe, which may be mathematically represented by a geometry which describes every point in three-dimensional space by means of coordinates. Incidentally, other ways of describing three-dimensional space exist. A 3D modeled object refers essentially to specifications, from which geometry is generated. A 3D modeled object is thus a mathematical description depicting of a 3D object, that is, a collection of points in 3D space, connected by various geometric entities such as triangles, lines, curved surfaces, etc.

A 3D modeled object is represented by a 3D representation of the 3D modeled object. In general, the 3D representation is displayed in a GUI, and therefore, may be displayed in a scene (or 3D scene). The representation is the result of a rendering (also referred to as 3D rendering) which is usually defined as a process of generating an image from a model. Typically, the generation of a 3D modeled object is obtained by computing data representative of the 3D model object.

The rendering of an object can be performed using parameters that do not directly depend on the object itself and that would modify the object rendering. Such a modification is called "temporary modification" or "rendering modification" as the modification of the object property is not saved. On the contrary, modifying the properties of an object is a permanent modification if the modifications of properties are saved.

The representation allows working on the 3D modeled object, that is, the user can construct and manipulate the 3D modeled object via the displayed 3D representation. For instance, the user can manipulate on the fly the point of view, the angle of view of the displayed 3D representation of the 3D modeled object. In contrast, a 2D representation does not allow the user such manipulations.

In practice, a first object of the scene is identified as an active object, as illustrated in step S20. From the system standpoint, said active object is identified as such. The identification of the first object of the scene may be performed upon user-selection. The user may carry out the selection via a haptic device such as a keyboard, a mouse, a stylus, or the like. For instance, in a two-button mouse, the left button could be used for selecting the active object. The system may also identify by default the active object, i.e. without requiring user selection. The system further identifies one or more second objects amongst objects displayed in the scene. The one or more second objects are the objects to be worked and are also referred to as target objects. As a result, the objects of the scene may be categorized into two types: an active object identified by the user or by default by the system, and at least one target object identified by the system.

The identification performed in the invention is advantageous compared to the solutions known in the art as the user does not need to identify the one or more target object displayed in the scene. Indeed, identifying target object may be a difficult and cumbersome task for the user, especially when the scene is overcrowded or comprises several target objects which are very close or overlapping.

Typically, the first object, i.e. the active object, is a tool for acting on at least one second object, i.e. a target object, as evoked above in reference to FIG. 1. Nevertheless, and for the sake of exemplification only, the first object will be hereafter considered an active object likely acting on a target object identified in the scene.

Next, at step S30, a property of the target object is modified according to a current distance between the active object and the target object. As shall be exemplified later, the property in question might be a rendering property.

Then, the scene is modified, step S40, according to the modified property of the target object. For instance, the rendering property of the target object may be impacted.

As evoked earlier, such a method does not need to materialize basically the distance between objects in the screen, whereby display of extrinsic elements is discarded. Therefore, the user is not disturbed by extrinsic elements and can more easily focus on his task inasmuch as extrinsic elements do not interfere the view of the scene. Further, the scene (notably the relative position of objects and perspective therein) is better understood by the user. In addition, there is no need to compute extrinsic elements and their display in the scene. In consequence, computational resources are preserved and may be, for instance, allocated to other tasks.

Preferably, the property of the target object is dynamically and thus progressively modified, that is, steps of modifying the property of the target object and the scene are carried out concomitantly with a user actuating (step S50) the active object in the scene. In practice, when the user moves the active object in the scene, the distance in the scene between the active object and the target object is changed and the property is modified according to the changing distance.

In operation, the actuation of the active object may be performed via a haptic device such as a keyboard, a mouse, a stylus, or the like. However, the actuation of the active object is not limited to these devices and any suitable means known in the art may be used.

Thus, a progressive modification of the scene is obtained, whereby modifications in the scene are made intuitive to the user. In particular, a dynamical process allows for an improved interaction with the user: the user can more easily work the target object as modifications in the relative arrangement of objects is continuously made apparent to the user, even when moving the active object (or the target object) (S60).

In addition, the active object may be a tool acting on the second object, upon user actuation of the first object identified as an active object. As evoked earlier in reference to the FIG. 1, there are various types of graphic tool for working on objects and on the scene. In this case, the tool acting on the second object performs permanent modifications of the properties of the second object, that is, the modifications of the properties are saved.

Typically, the property modified is a rendering property of the target object. Modifying the scene thus relies primarily on modifying the rendering of the target. In this respect, note that rendering is usually defined as a process of generating an image from a model. The model may be a description of a 3D objects, which can be more or less exhaustive. The result of a rendering denotes an alternate visualization that is applying to the object visualization attributes (color, transparency level, texture, lighting parameters, shading, and so forth)

which show certain characteristics of this object. The characteristics may be physical characteristics, resistance characteristics, or possibly other characteristics.

Thus, when the user actuates the active object in the scene, the rendering of the target object is dynamically modified. Therefore, the user can easily and progressively comprehend the modification on the property of the target object. For instance, if the user uses a milling tool (the active object) so as to round off the rough edges of a cubic object (the target object), she/he can easily and progressively see the changes carried out by the milling tool on the cubic object.

Furthermore, the method may include simulating effects of a light source attached to the active object. The property in question is in this case modified according to the light source simulated.

Preferably, the user selects and actuates on an active object in the scene which is a tool. Upon actuation on the tool, rendering modifications (or temporary modification) are performed to dynamically represent the changes of object distances. Based on the modified rendering of the scene, the user can estimate that the distances between the objects fulfill his or her requirements so that the user can ask the system for a permanent modification of object properties (e.g. the tool works on the target object perform). The temporary rendering modification thus allows the user to have a real-time and intuitive visual feedback of possibly time consuming distance-based object modifications to perform.

Light source is here meant as any electromagnetic or thermal source (especially when simulating physical properties of target objects). The user can see the change in the relative distance in a continuous and natural manner, without the need of prior selection of pairs of points to determine a distance. In addition, simulation of a light source will light many points (theoretically an infinity) on a surface of the target object, that the user can apprehend simultaneously without interferences.

Advantageously, while effects of the light source are simulated according to a location of the active object, the simulation ignores a configuration and/or geometry of the active object. Accordingly, the light source simulated can reach the target object, i.e. the target object is illuminated by the active object, even if the source is positioned "in" the active object. Hence, in this embodiment, the light source is not simply attached to the active object and surrounding objects rendered accordingly, but from the light simulation standpoint, the active object is considered absent from the scene. For instance, in a rasterizating process, the light source simulated is not occluded by the geometry of the active object, event if put inside a mesh. In the field of computer graphics, rasterization is the task of taking an image described in a vector graphics format and converting it into a raster image for output on a display.

In addition, the active object may preferably be rendered independently from the light source simulated. Thus: basically, the active object is not lighted as any other target objects, to allow better discrimination of objects in the scene by the user. Therefore, the user can still see the active object, without being disturbed by the light which can pass through the active object, even if the light source is enclosed in the active object.

Preferably, the property of the target object and/or the scene may be modified via the execution of a shader. In the field of computer graphics, a shader is a set of software instructions, which is used by the graphic resources primarily to perform rendering effects. Thus, a shader program is executed so as to obtain the rendering of the target object. Advantageously, here the active tool is rendered independently from a shader program used to render target objects in the scene. In consequence, computational resources are preserved as the active object is rendered independently of the shader used to render target objects.

In addition, modifying the property of the target object may comprise modifying a specular reflectivity of a surface thereof. In the field of 3D rendering, specularity is a quantity which represents the amount of specular reflectivity that a surface has. Such a property is used to determine the brightness of specular highlights, along with shininess to determine the size of the highlights. Moreover, the specular reflection of light direct from point light sources is modelled as specular highlights. As a result, several computational resources are saved inasmuch as the computation of the specular reflection of light requires less computational resources as the computation of specular highlight.

Advantageously, modifying the property of the target object may also comprise modifying a surface normal (or simply normal) of a surface. In the field of computer graphics, normals are used to determine a surface's orientation toward a light source for flat shading, or the orientation of each of the corners (vertices) to mimic a curved surface. Thus, normals are used for lighting calculation.

More generally, the modified property can be chosen amongst the properties of rendering property, geometrical property, and physical property or the like. Rendering property relates to the object visualization, which may be characterized by attributes such as color, transparency level, texture, lighting parameters, shading, and so forth. Geometrical property relates to size, shape, and relative position of figures and with properties of space. Physical property is any aspect of an object or substance that can be measured or perceived without changing its identity. The invention is not limited to the properties cited above and any property of the target object may be modified.

Advantageously, the property of the target object may be modified according to a direction defined by the active object and the target object, in addition to their distance. This typically arises when a directional rather than omnidirectional light is simulated. A better focus on the target object is thereby provided to the user.

Typically, the product edition system comprises a database which comprises specifications of objects displayed in the scene. In particular, the specifications of the objects stored in the database allow for generating a geometry, which in turn allows generating a representation of the objects. Advantageously, the modified property may be stored or updated on the same database.

In a variant, the modified property may be stored on a volatile memory, for accelerating the process.

As previously evocated, objects are displayed in a scene. Typically, the scene is a three-dimensional object scene.

In practice, the user may first select a first active object, whereby the light source automatically attaches to said active object. He/she may then switch to another active object, whereby the light source automatically attaches to the currently selected active object (step S70). Thus, the system automatically determines the location where to attach the light source. For instance, the system may determine that the light source is attached on the center of mass of the active object. The location of the light source is not limited to the center of mass, and any suitable location may be automatically selected by the system.

Incidentally, the user may choose the location where the light source is attached on the selected active object. Indeed, the active object may offer several locations where the user may wish to attach the light source. The free choice of the location where to attach the light source on the selected tool improves the interaction between the user and the scene as the location of the light source reflects a choice of the user. The selection of the location may be carried out via a haptic device such as a keyboard, a mouse, a stylus, or the like. The selection of the location is not limited to these devices and may be performed by any suitable means known in the art.

In a variant, the first object may be identified by default as the active object, depending on the ergonomical context.

FIGS. 4A, 4B, 4C, 4D exemplify the results of steps S20-S50 of the invention in the flowchart of FIG. 3. Here, two objects (500-600) are contemplated. While they are meant to be typically displayed on a computer screen within a graphical user interface of a product edition system such as depicted in FIG. 1, the three dimensional objects scene represented here restricts to the two objects 500, 600 only.

Figure 4A:
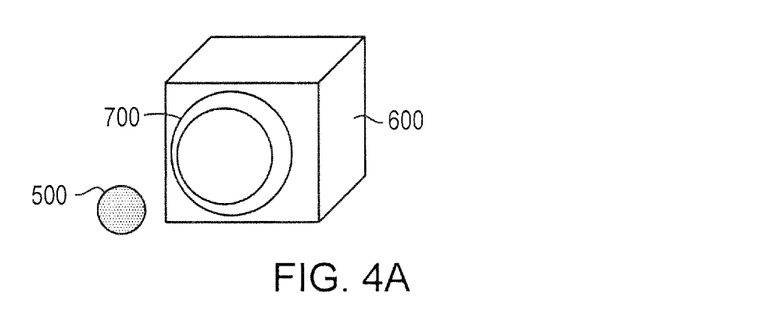
FIGS. 4A, 4B, 4C, 4D are schematic views of a two-objects scene in which the invention is carried out.

FIG. 4A represents an initial view. The first object 500 identified as an active object has a spherical shape. The second object 600 identified as a target object is a cube. The active object 500 is a tool intended for acting on the cube. For example, the tool is the milling tool evoked earlier for putting the cube in shape.

In the embodiment depicted in FIG. 4, the selection of the tool is the result of a previous user-selection (not depicted) as evoked above.

A light source is here simulated and attached at the tool. Note that an electromagnetic or a thermal source could be attached to the tool as well. However, here the user can advantageously see the change in the relative distance in a continuous manner. As noted above, the simulation preferably ignores the configuration and/or the geometry of the tool so as to preserve computational resources, as seen previously.

Next, simulating the light source impacts a specularity 700 of the cube (the target object), here depicted schematically by contour lines. The rendering of the cube 600 is accordingly impacted.

Figure 4B:
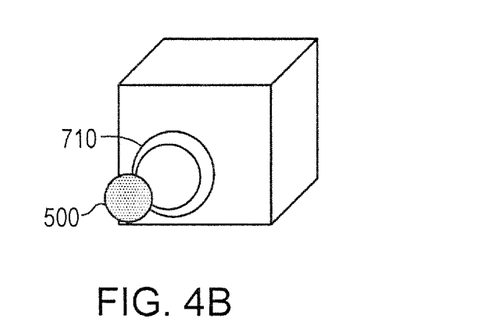
Figure 4C:
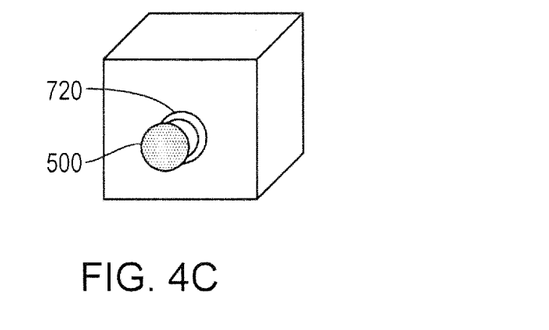
Figure 4D:
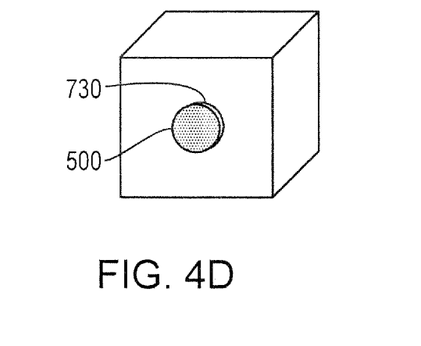

As can be seen on FIG. 4B-4D, while the user moves the tool (the active object) 500 closer and closer to a face of the cube, the specularity 710, 720, 730 is progressively impacted. In the last figure (FIG. 4D), as no more light reflection appears, the user is informed that the tool 500 is touching or about to touch the cube 600. The temporary rendering of modification thus allows the user to have a real-time and intuitive visual feedback of the distance between the tool 500 and the face of the cube 600 so that the user can ask the system for a permanent modification of object properties (e.g. the tool 500 performed works on the target object 600). Note that such a progressive depiction would not be possible with a classical arrow-based depiction of the distance.

Therefore, the user can evaluate the distance between the active object (the tool) 500 and the target object (the cube) 600 in an easy, progressive, and dynamic manner. The user knowledge of the distance between the active object and the target object, and more generally the user knowledge of the scene, is thus improved.

Figure 5:
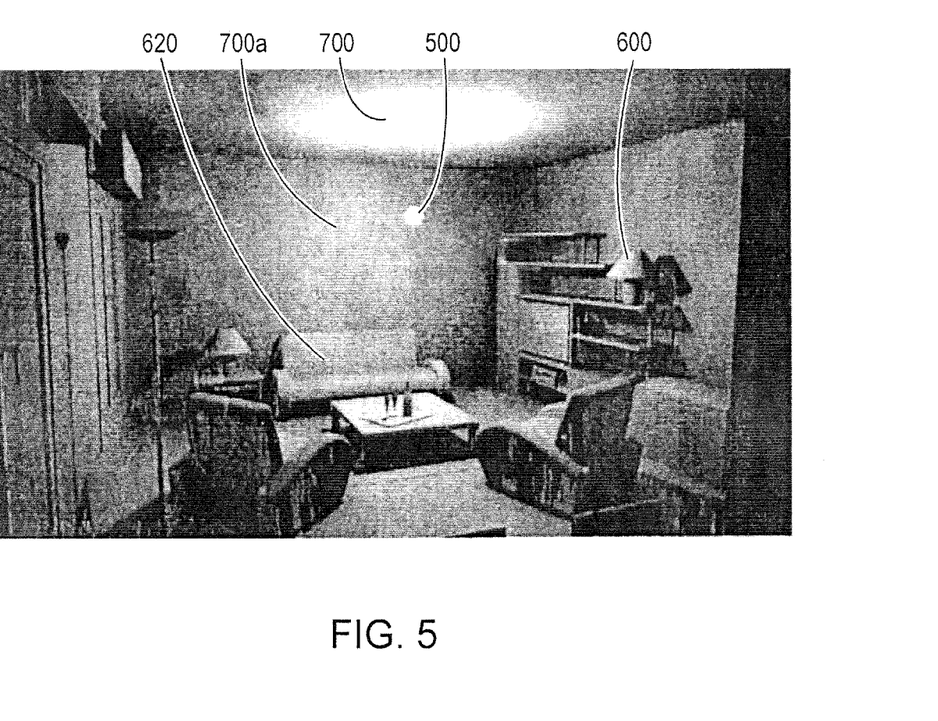
FIG. 5 exemplifies an active object in a scene in the graphical user interface of FIG. 1 that can be displayed according to an embodiment of the invention.

FIG. 5 shows a typical screenshot of a tool 500 (here white) located intermediately near a ceiling 700. While the ceiling is predominantly lighted, other objects 600, 620, 700a in the scene can be impacted too. However, since renderings depend on the relative distance involved, the user can easily grasp the relative situation of each object at stake. Thus, the scene is better understood by the user.

It is to be understood that the foregoing method can be applied to any object in any configuration capable of being defined by a CAD/CAM/CAE system, or any system used to display views of an object from varying viewpoints. The invention may be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language or in assembly or machine language if desired; and in any case, the language may be a compiled or interpreted language.

Generally, a processor will receive instructions and data from a read-only memory and/or a random access memory. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed ASICs (application-specific integrated circuits).

The preferred embodiment of the present invention has been described. It will be understood that various modifications may be made without departing from the spirit and scope of the invention. Therefore, other implementations are within the scope of the following claims. For instance, any source which may affect or interact with the other objects properties such as an electromagnetic or thermal source, as well as gravitational source could be attached at the tool as well.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of visualization of objects displayed on a computer screen, the objects being displayed in a scene, within a graphical user interface of a product edition system that performs Computer-Aided Design (CAD) operations on an object, comprising the steps of:
   displaying at least two objects in a scene within a graphical user interface of the product edition system that performs CAD operations on an object;
   identifying a first object and a second object amongst the at least two objects displayed in the scene, the first object being identified as an active object that is an editing tool for working on at least one of a geometrical property and a physical property of the second object upon user actuation;
   attaching a light source at the first object and simulating effects of the light source, said attaching resulting in the first object effectively serving as a single tool that combines functions of the editing tool and the light source;
   with the light source attached at the first object, modifying at least one of the geometrical property and the physical property of the second object according to a distance between the first object and the second object; and modifying the scene according to the modified ones of the geometrical property and the physical property of the second object and according to the simulated light source effects, the first object having the light source attached and as a result combining functions of the editing tool and the light source; and storing in computer memory the modified ones of the geometrical property and the physical property of the second object.

2. The method of claim 1, wherein the steps of modifying at least one of the geometrical property and the physical property of the second object and modifying the scene are carried out concomitantly with a user actuating the first object in the scene.

3. The method of claim 1, wherein:
at the step of simulating, the effects of the light source are simulated according to a location of the first object, the simulation ignoring at least one of a configuration and a geometry of the first object.

4. The method of claim 1, wherein the step of modifying the scene further comprises rendering the first object independently of the light source being simulated.

5. The method of claim 4, wherein at least one of the step of modifying at least one of the geometrical property and the physical property and the step of modifying the scene further comprises executing a shader program for rendering the second object, the first object being rendered independently of said shader.

6. The method of claim 1, wherein the step of modifying at least one of the geometrical property and the physical property comprises modifying a specular reflectivity of a surface of the second object.

7. The method of claim 1, wherein the step of modifying at least one of the geometrical property and the physical property comprises modifying a surface normal of a surface of the second object.

8. The method of claim 1, wherein the step of modifying at least one of the geometrical property and the physical property further comprises modifying the at least one of the geometrical property and the physical property of the second object according to a direction defined by the first object and the second object.

9. The method of claim 1, wherein the product edition system comprises a database, the database comprising specifications of said objects, the specifications allowing generating geometry and a representation of said objects, and wherein the step of storing the modified ones of the geometrical property and the physical property of the second object stores said modified ones on said database.

10. The method of claim 1, wherein the product edition system comprises a database, the database comprising specifications of said objects, the specifications allowing generating geometry and a representation of said objects, and wherein the step of storing the modified ones of the geometrical property and the physical property of the second object stores said modified ones on a memory, without storing the modified ones on said database.

11. The method of claim 1, wherein the scene is a three-dimensional object scene.

12. The method of claim 1, wherein, at the step of identifying, the first object is identified as an active object by default or upon user-selection.

13. The method of claim 1, wherein the tool acting on the second object performs permanent modifications of properties of the second object.

14. The method of claim 1, wherein:
at the step of modifying at least one of the geometrical property and the physical property of the second object according to a distance between the first object and the second object, the property modified is a temporary modification of a rendering property of said second object in the scene; and the step of modifying the scene comprises temporarily modifying the rendering of said second object in the scene according to the temporarily modified rendering property.

15. A computer program product comprising:
a non-transitory computer readable medium; and
a computer program stored on a non-transitory computer readable medium for displaying at least two objects in a scene in a Graphical User Interface of a product edition system that performs Computer-Aided Design (CAD) operations on an object, comprising code means for causing a computer onto which said computer program is loaded to carry out the steps of:

identifying a first object and a second object amongst the at least two objects displayed in the scene, the first object being identified as an active object that is an editing tool for working on at least one of a geometrical property and a physical property of the second object upon user actuation;

attaching a light source at the first object and simulating effects of the light source, such that the first object serves as a single tool that combines functions of the editing tool and the light source;

with the light source attached at the first object, modifying at least one of the geometrical property and the physical property of the second object according to a distance between the first object and the second object; and modifying the scene according to the modified ones of the geometrical property and the physical property of the second object and according to the simulated light source effects, the first object having the light source attached and combining functions of the editing tool and the light source; and storing the modified ones of the geometrical property and the physical property of the second object.

16. The computer program product according to claim 15, wherein modifying at least one of the geometrical property and the physical property of the second object and modifying the scene are carried out concomitantly with a user actuating the first object in the scene.

17. The computer program product according to claim 15, wherein the first object is a tool acting on the second object, upon user actuation of the first object, the said tool performing permanent modifications of properties of the second object; and wherein:

modifying at least one of the geometrical property and the physical property of the second object according to a distance between the first object and the second object comprises a temporary modification of a rendering property of said second object in the scene; and modifying the scene comprises temporarily modifying the rendering of said second object in the scene according to the temporarily modified rendering property.

18. The computer program product according to claim 15, wherein the effects of the light source are simulated according to a location of the first object, the simulation ignoring at least one of a configuration and a geometry of the first object.

19. The computer program product according to claim 15, wherein the product edition system comprises a database, the database comprising specifications of said objects, the specifications allowing generating geometry and a representation of said objects, and the computer program stores the modified ones of the geometrical property and the physical property on said database.

20. A computer-based like product edition system configured to perform Computer-Aided Design (CAD) operations on an object, comprising:

a processor, and coupled thereto:

means for displaying at least two objects in a scene in a Graphical User Interface of the product edition system configured to perform CAD operations on an object;

means for identifying a first object and a second object amongst the at least two objects displayed in the scene, the first object being identified as an active object that is an editing tool for working on at least one of a geometrical property and a physical property of the second object upon user actuation;

means for attaching a light source at the first object and simulating effects of the light source, such that the first object combines functions of the editing tool and the light source;

means for modifying at least one of the geometrical property and the physical property of the second object according to a distance between the first object and the second object, the light source being attached at the first object;

means for modifying the scene according to the modified ones of the geometrical property and the physical property of the second object and according to the simulated light source effects, the first object having the light source attached and combining functions of the editing tool and the light source; and means for storing the modified ones of the geometrical property and the physical property of the second object.

21. The product edition system of claim 20, wherein the means for modifying at least one of the geometrical property and the physical property of the second object and the means for modifying the scene are adapted to be carried out concomitantly with a user actuating the first object in the scene.

22. The product edition system of claim 20, wherein the first object is a tool acting on the second object, upon user actuation of the first object, the said tool performing permanent modifications of properties of the second object; and wherein:

the means for modifying at least one of the geometrical property and the physical property of the second object according to a distance between the first object and the second object are adapted to carry out a temporary modification of a rendering property of said second object in the scene; and the means for modifying the scene are adapted to temporarily modify the rendering of said second object in the scene according to the temporarily modified rendering property.

23. The product edition system of claim 20, wherein the effects of the light source are simulated according to a location of the first object, the simulation ignoring a configuration and/or geometry of the first object.

24. The product edition system of claim 20, further comprising:

a database, the database comprising specifications of said objects, the specifications allowing generation of a geometry and a representation of said objects; and further coupled to the processor, means for storing the modified ones of the geometrical property and the physical property on said database.

\* \* \* \* \*